(12) United States Patent
Rosenblatt et al.

(10) Patent No.: US 9,513,314 B2
(45) Date of Patent: Dec. 6, 2016

(54) CONFIGURABLE TESTING PLATFORMS FOR CIRCUIT BOARDS WITH REMOVABLE TEST POINT PORTIONS

(71) Applicant: Apple Inc., Cupertino, CA (US)

(72) Inventors: Michael Rosenblatt, Boulder, CO (US); W. Bryson Gardner, San Francisco, CA (US); Amir Salehi, San Jose, CA (US); Tony Aghazarian, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 889 days.

(21) Appl. No.: 13/739,917

(22) Filed: Jan. 11, 2013

(65) Prior Publication Data

US 2013/0127488 A1 May 23, 2013

Related U.S. Application Data

(62) Division of application No. 11/973,793, filed on Oct. 9, 2007, now Pat. No. 8,362,793.
(Continued)

(51) Int. Cl.
    *G01R 31/02* (2006.01)
    *G01R 1/04* (2006.01)
    (Continued)

(52) U.S. Cl.
    CPC ......... *G01R 1/0408* (2013.01); *G01R 31/2818* (2013.01); *H05K 1/0268* (2013.01);
    (Continued)

(58) Field of Classification Search
    CPC ............ G01R 31/2808; G01R 31/2818; G01R 1/0408; G01R 1/0483; G01R 1/0466; G01R 1/06705
    (Continued)

(56) References Cited

U.S. PATENT DOCUMENTS 4,968,589 A  11/1990 Perry
5,166,602 A  11/1992 Byford et al.
(Continued)

FOREIGN PATENT DOCUMENTS

CN  1316650  10/2001
CN  2550772   5/2003
(Continued)

OTHER PUBLICATIONS

Taiwan Appln. No. 096138771, Office Action and Search Report (Feb. 4, 2013).

*Primary Examiner* — Vincent Q Nguyen
(74) *Attorney, Agent, or Firm* — Downey Brand LLP

(57) ABSTRACT

Circuit boards are provided that include a functional portion and at least one removable test point portion. The removable test point portion may include test points which are accessed to verify whether the functional portion is operating properly or whether installed electronic components are electrically coupled to the board. If multiple boards are manufactured together on a single panel (in which the individual boards are broken off), the test points can be placed on bridges (e.g., removable portions) that connect the individual boards together during manufacturing and testing. Configurable test boards are also provided that can be adjusted to accommodate circuit boards of different size and electrical testing requirements. Methods and systems for testing these circuit boards are also provided.

14 Claims, 19 Drawing Sheets

Related U.S. Application Data

(60) Provisional application No. 60/857,336, filed on Nov. 7, 2006.

(51) Int. Cl.
*G01R 31/28* (2006.01)
*H05K 1/02* (2006.01)
*H05K 3/00* (2006.01)
*H05K 3/40* (2006.01)

(52) U.S. Cl.
CPC ............ *H05K 3/0052* (2013.01); *H05K 3/403* (2013.01); *H05K 2201/09127* (2013.01); *H05K 2201/09181* (2013.01)

(58) Field of Classification Search
USPC .................................................... 324/762.01
See application file for complete search history.

(56) References Cited

U.S. PATENT DOCUMENTS

| | | |
|---|---|---|
| 5,315,241 A | 5/1994 | Ewers |
| 5,446,395 A | 8/1995 | Goto |
| 5,657,139 A | 8/1997 | Hayashi |
| 5,896,037 A | 4/1999 | Kudla et al. |
| 5,963,045 A | 10/1999 | Zink et al. |
| 6,069,482 A | 5/2000 | Hilton |
| 6,117,707 A | 9/2000 | Badehi |
| 6,250,933 B1 | 6/2001 | Khoury et al. |
| 6,326,553 B1 | 12/2001 | Yim et al. |
| 6,399,896 B1 | 6/2002 | Downes, Jr. et al. |
| 6,607,941 B2 | 8/2003 | Prabhu et al. |
| 6,626,682 B2 * | 9/2003 | Sausen ................. G01R 1/0483 324/750.19 |
| 6,667,630 B2 * | 12/2003 | Abdulky ............ G01R 31/2808 324/754.03 |
| 6,750,926 B2 | 6/2004 | Ohgiichi et al. |
| 6,759,865 B1 | 7/2004 | Gu et al. |
| 6,900,655 B2 | 5/2005 | Kumamoto |
| 7,106,088 B2 | 9/2006 | Tsai et al. |
| 7,145,357 B2 | 12/2006 | Lee |
| 7,190,593 B2 | 3/2007 | Aiki et al. |
| 2003/0178988 A1 | 9/2003 | Kim |
| 2004/0207423 A1 * | 10/2004 | Mizoguchi ......... G01R 31/2808 324/750.19 |
| 2004/0217767 A1 | 11/2004 | Diorio et al. |
| 2005/0122127 A1 | 6/2005 | Grillette |
| 2005/0179455 A1 | 8/2005 | Cooper et al. |
| 2005/0191855 A1 | 9/2005 | Chen et al. |
| 2008/0084225 A1 | 4/2008 | Salehi et al. |
| 2009/0121736 A1 | 5/2009 | Jenkins et al. |

FOREIGN PATENT DOCUMENTS

| | | |
|---|---|---|
| CN | 1451097 | 10/2003 |
| CN | 2831123 | 10/2006 |
| JP | 2003149296 | 5/2003 |
| TW | 361630 | 6/1999 |
| TW | M294037 | 7/2006 |
| WO | WO9818015 | 4/1998 |

\* cited by examiner

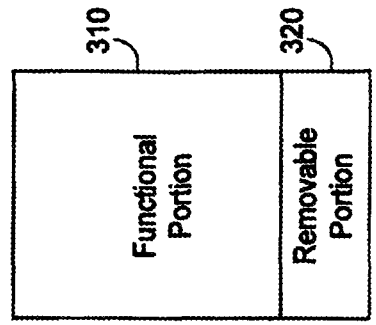
FIG. 3C
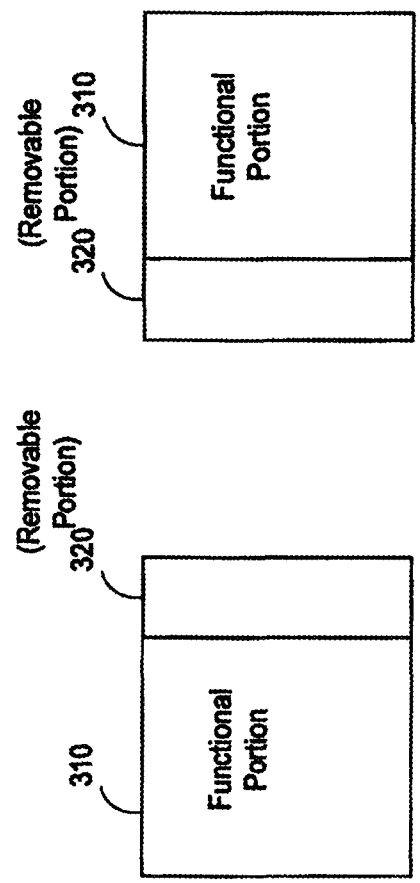
FIG. 3B
FIG. 3A

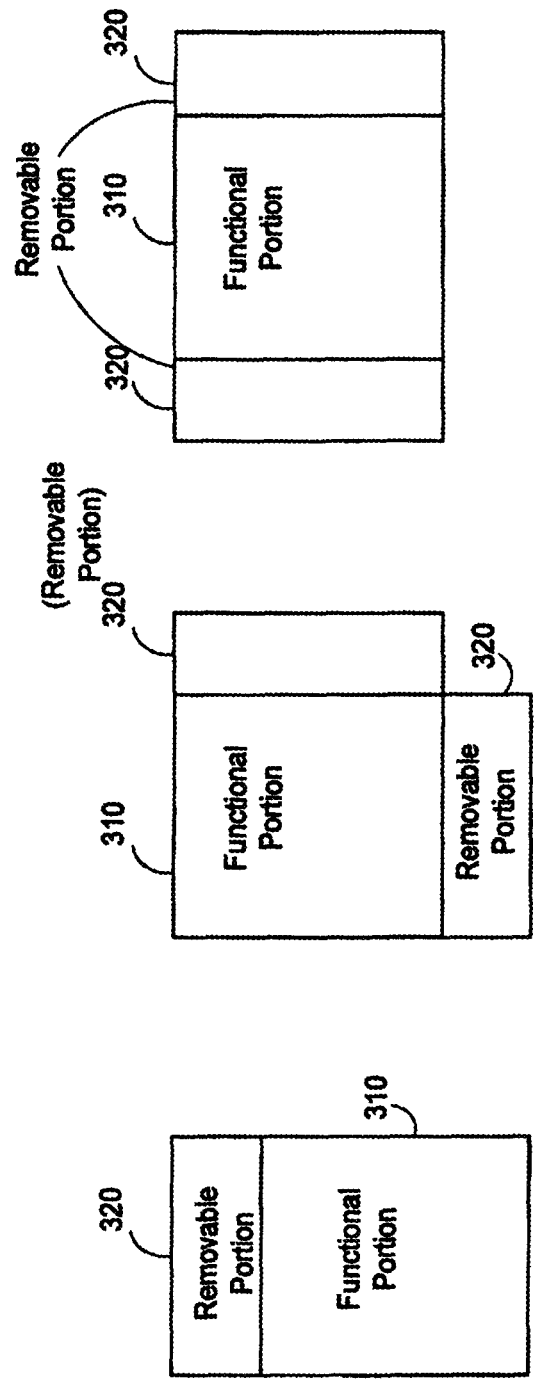

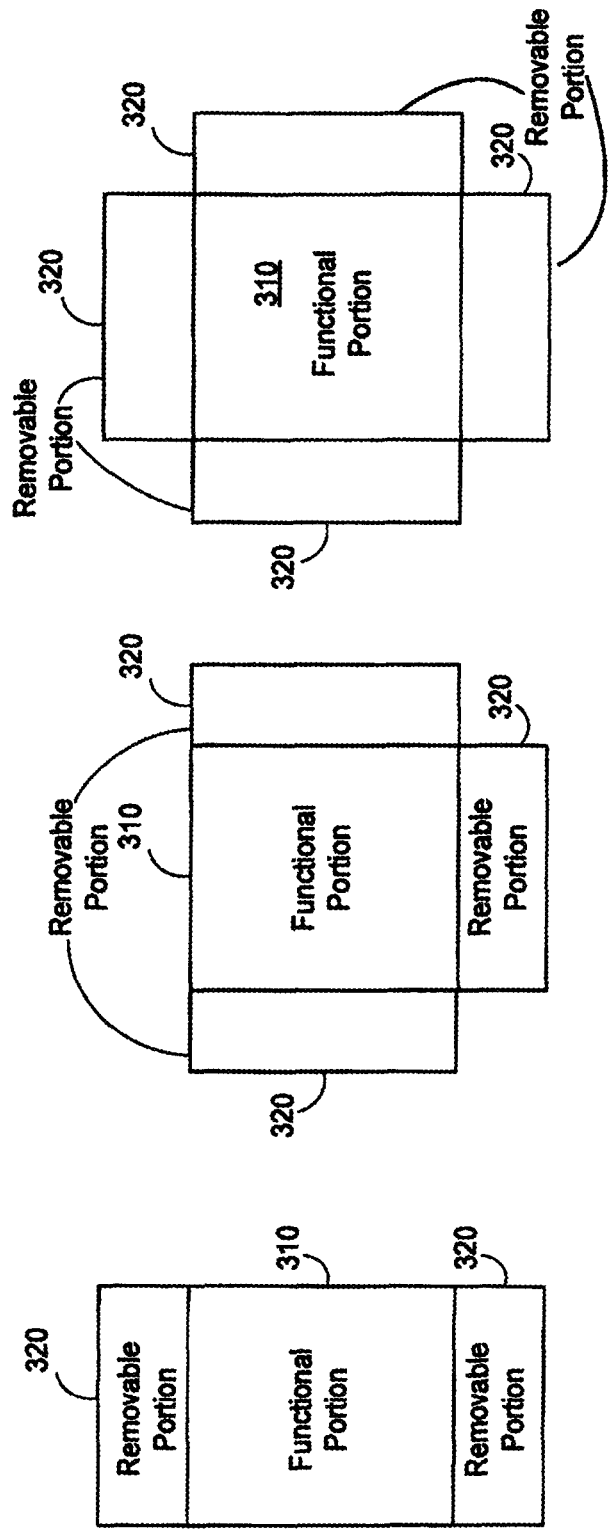

CONFIGURABLE TESTING PLATFORMS FOR CIRCUIT BOARDS WITH REMOVABLE TEST POINT PORTIONS

CROSS-REFERENCE TO RELATED APPLICATIONS

The present invention is a Divisional Application which claims priority to U.S. application Ser. No. 11/973,793, filed Oct. 9, 2007, entitled "CIRCUIT BOARDS INCLUDING REMOVABLE TEST POINT PORTIONS AND CONFIGURABLE TESTING PLATFORM", which claims priority to Provisional Patent Application No. 60/857,336, filed Nov. 7, 2006, entitled "CIRCUIT BOARDS INCLUDING REMOVABLE TEST POINT PORTIONS AND CONFIGURABLE TESTING PLATFORM", all of which are hereby incorporated by reference herein in its entirety.

BACKGROUND OF THE DISCLOSURE

This relates to circuit boards including a removable test point portion and to configurable testing platforms for testing circuit boards.

Circuit boards such as printed circuit boards (PCBs), logic boards, printed wiring boards, etched wiring boards, and other known boards may be used to mechanically support and electronically connect electronic components (e.g., integrated circuits, resistors, transistors, and capacitors). Circuit boards are typically constructed using one or more layers of a non-conductive substrate and signal conducting pathways. The signal conducting pathways may exist in one or more layers or in each layer of the non-conductive substrate. The signal conducting layers, sometimes referred to as traces, members, or leads, may be a metal conductive material (e.g., copper or gold) or an optical conductive material (e.g., fiber optics).

Electronic components may be mounted to the circuit board using a through-hole construction or a surface-mount construction and electronically coupled to one or more signal-conducting pathways via soldering. When the electronic components are physically and electrically coupled to the board, tests may be performed to check, for example, the interconnection of signal conducting paths and electronic components, proper component installation and operation, electromagnetic compliance, electrostatic discharge, and other suitable testing parameters. Such tests may be performed by applying probes to test points or test nodes populated throughout the circuit board.

Test points may be electrically connected to the signal conducting pathways and thus operative to provide test data to a probe connected thereto. FIG. 1 shows a top view of a simplified block diagram of a prior art circuit board 100 including a functional portion 110 and test points 120 (shown as cross-hatched squares) disposed among functional portion 110. A disadvantage of test points in conventional circuit boards, such as that shown in FIG. 1, is that they occupy valuable "real estate" on the board, thereby limiting the end-use functional efficiency of the board that would otherwise be obtained but for the presence of the test nodes. That is, the test points occupy real estate that would be better utilized by electronic components. As a result, test points, while necessary to perform tests, limit scaling (e.g., miniaturization) of the board and component density. Accordingly, what is needed is a circuit board that maximizes end-use functional efficiency while providing test points for use in performing tests.

Testing platforms for performing tests on circuit boards are known. For example, one known testing machine may include a computer operated probe that is moved from one test node to another. However, such testing platforms may require sophisticated and expensive robotics to move the test probe to specific locations on the circuit board. In addition, such robotics may require sophisticated control software for each circuit board being tested. Other testing platforms, which are not as flexible as robotic based testing platforms, include custom-made testing platforms specifically designed to test a particular circuit board. Such platforms may include a top test panel and bottom test panel which each include specifically arranged probes that are interfaced with test points on the circuit board. Drawbacks of these custom-made platforms include expensive manufacturing cost, limited lifespan, and inability to test more than one circuit board. Accordingly, what is needed is a versatile testing platform capable of testing many different types of circuit boards.

SUMMARY OF THE DISCLOSURE

A circuit board that maximizes end-use functional efficiency while providing test nodes for use in performing tests is provided. End-use functional efficiency is maximized and test nodes are provided in a circuit board constructed in accordance with the principles of the present invention to include a functional portion and a least one removable test node portion. As defined herein, the functional portion is the portion of the circuit board that may be used for an end-use purpose (e.g., in a consumer electronic device). For example, the functional portion may include the electronic components (e.g., processor, memory, battery, capacitors, etc.) necessary for the end-use purpose. The removable test node portion includes test nodes that are electrically coupled to signal conducting pathways in the functional portion to permit desired testing of the functional portion at, for example, a test site. After the desired testing is performed, the removable portion may be removed, thereby leaving only the functional portion for the end-use purpose.

Other circuit boards may be provided that include two or more functional portions that share a removable test point portion. The shared removable test point portion may serve as a bridge that may serve an interconnecting framework for enabling a circuit board to be populated with several functional portions. An advantage of using shared removable test point portions is that it may be sized to yield a circuit board for testing by existing testing devices. For example, because the location of test probes of a testing device is known, shared removable test point portions may be constructed such that the test probes of the testing device align with the test points located on the shared portions when the test probes are applied.

Configurable testing platforms are provided for interfacing with and testing circuit boards of different types and sizes, in particular circuit boards having side mounted test points. Side mounted test points, as opposed to top or bottom mounted test points, exist on the edge of the board. Configurable platforms may be physically configurable to receive circuit boards of different size and electrically configurable to test different types of circuit boards (e.g., circuit boards having different end-use purposes), thereby providing a "universal" testing platform.

The physical configurability may be realized using circuit boards having side mounted test points because the location of the side mounted test points may not vary in the same manner as top or bottom mounted test point may vary. That is, for any given circuit board having side mounted test points, many such circuit boards may be constructed to have similar standards. Therefore, regardless of the length and width of the circuit board, use of side mounted test points may be consistent from one board to the next. Such consistency provides a stable foundation for constructing a test probe array, which may interface with the side mounted test points, regardless of board size and end-use purpose.

Electrical configuration may be accomplished using test probe signal selection circuitry. Different boards, and thus the test points of those boards, may require specific signals during testing. The test probe array or arrays of a configurable testing platform may be configured under the direction of test probe signal selection circuitry to provide each test probe a desired signal.

BRIEF DESCRIPTION OF THE DRAWINGS

The above and other features of the present invention, its nature and various advantages will become more apparent upon consideration of the following detailed description, taken in conjunction with the accompanying drawings, in which like reference characters refer to like parts throughout, and in which:

FIGS. 3A-L show top views of different circuit boards according to the principles of the present invention;

DETAILED DESCRIPTION OF THE DISCLOSURE

Figure 1:
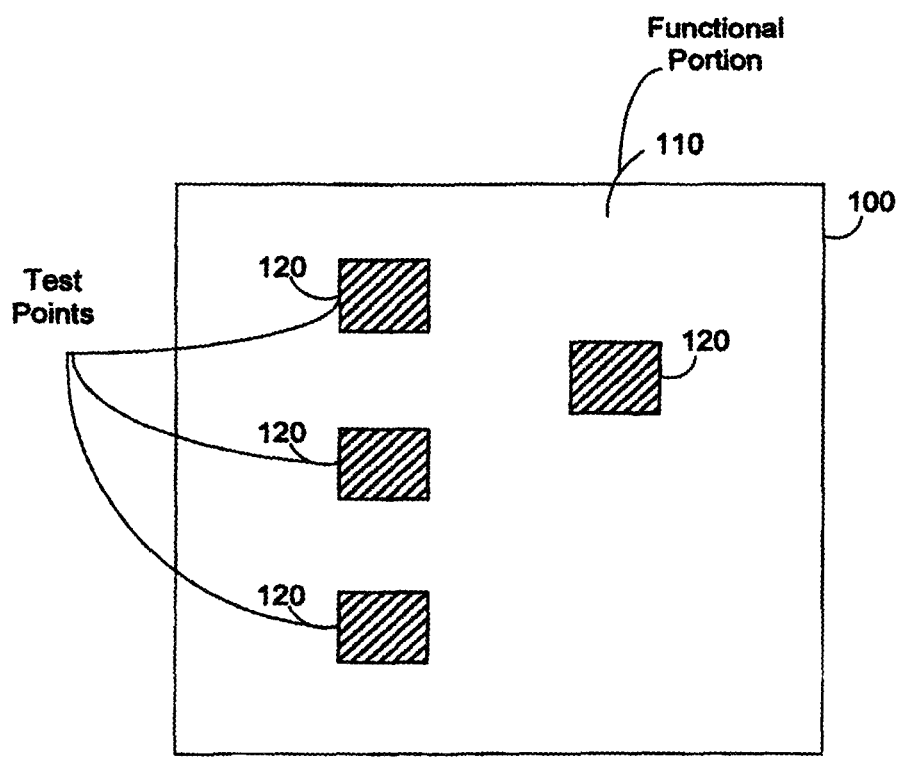
FIG. 1 shows a top view of a simplified block diagram of a prior art circuit board.
Figure 2:
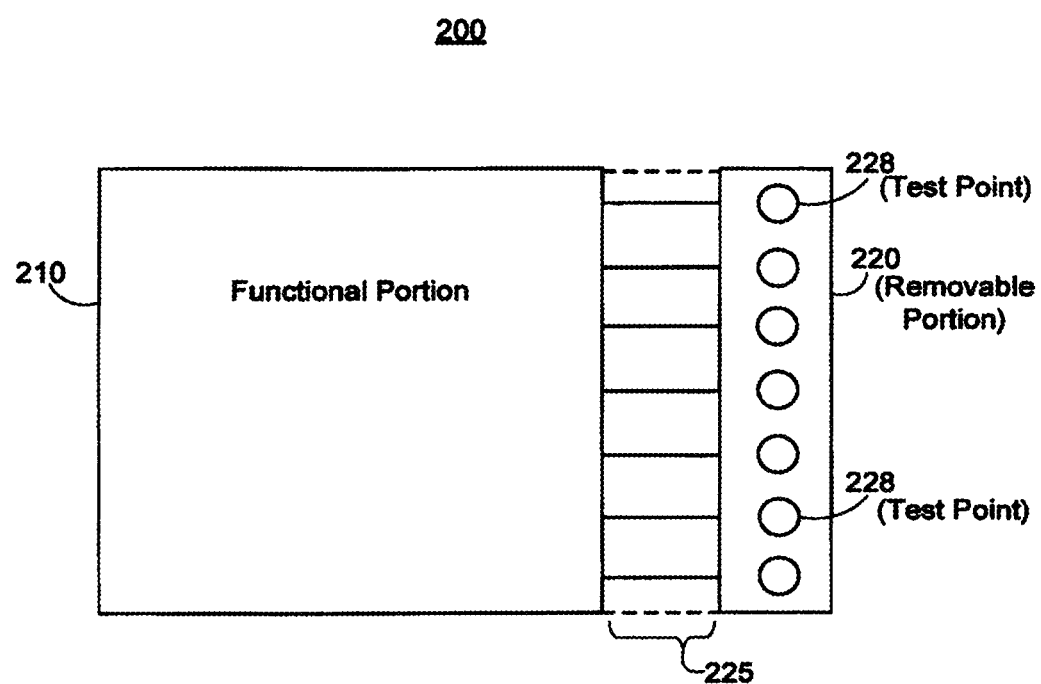
FIG. 2 shows a top view of a simplified block diagram of a circuit board constructed in accordance with the principles of the present invention.

FIG. 2 shows a top view of a simplified block diagram of a circuit board 200 constructed in accordance with the principles of the present invention. As shown, circuit board 200 includes functional portion 210 and removable test point portion 220. Functional portion 210 may include the electronic components (not shown), and any software that may be stored and/or processed by one or more of the components, that may ultimately be used for an end-use purpose. Signal conducting pathways (not shown in functional portion 210 though shown extending from portion 210 to portion 220) may exist in one or more layers of circuit board 200. Test conductors 225 (which are a type of signal conducting pathway, and thus may also exist in one or more layers of circuit board 200) may provide a substantially direct pathway between a test point 228 in portion 220 and one or more test sites (e.g., a component of portion 210 or an interconnection between a component and circuit board 200) in portion 210. In some embodiments, test conductors 225 may be signal conducting pathways specifically placed in circuit board 200 for testing purposes only. In other embodiments, test conductors may be signal conducting pathways that may serve multiple purposes. For example, a test conductor may serve as both a test conductor for enabling tests to be performed and, after removable portion 220 is removed, a signal conducting pathway for transmitting signals in an end-use application.

Note that the representation of functional portion 210 and removable portion 220 in FIG. 2 is merely illustrative. As shown, removable portion 220 is attached to functional portion via test conductors 225, whereas the actual portions may not be attached. FIG. 2 shows dashed lines extending between portions 210 and 220 to illustrate, that in some embodiments, portions 210 and 220 may actually be attached to each other (e.g., portion 210 is direct physical contact with portion 220) or may be attached to each other by an interposing medium. Actual board construction (e.g., how portions 210 and 220 are attached) may be a matter of design choice and need not be limited to the examples and representations discussed herein.

In circuit boards having multiple layers, test conductors 225 and other signal conducting pathways may preferably be located in the middle layers to maximize available real estate for electronic components on the top, bottom or both top and bottom portions of the circuit board. It is understood that even if test conductors and other signal conducting pathways are primarily located in the middle layers, such pathways may also be present in the top, bottom, or both top and bottom layers. It is further understood that the principles of the present invention can be applied to any type of circuit board configuration, regardless of whether it is a single or multilayer layer construction.

Removable test point portion 220 may include several test points 228 which may be electrically coupled to test conductors 225. As defined herein, a test point is a region where signals can be applied thereto and/or extracted therefrom, for example, by a testing platform for testing a test subject or subjects of portion 210. Test points 228 may reside on a top portion, a bottom portion, both top and bottom portions, a side portion, two or more side portions, or any combination thereof of circuit board 200. The side portion refers to an edge of a circuit board (as opposed to a top or bottom portion). A more detailed explanation of test points residing in a side portion may be found in U.S. patent application Ser. No. 11/545,958, filed Oct. 10, 2006, entitled "Method and Apparatuses for Testing Circuit Boards," the disclosure of which is hereby incorporated by reference herein in its entirety.

In circuit board embodiments which include test points located on the top, bottom, or both top and bottom portions, such circuit boards may be constructed such that removable test point portion 220 includes a majority or all of the test points. Such construction advantageously yields a functional portion of circuit board 200 having enhanced end-use functional efficiency. That is, by concentrating the test points in removable portion 200, the size of functional portion 210 may be reduced. In addition, the density of electronic components may be increased. In other circuit board embodiments which include test points located on at least one side and on the top, bottom, or both top and bottom portions, such circuit boards may be constructed such that the test points on the top, bottom, or both top and bottom portions are concentrated in removable portion 220. In yet other circuit board embodiments which have only side mounted test points, such circuit boards may be constructed such that those test points are located on removable portion 220.

It is understood that although in some embodiments it may be preferable to concentrate the location of test points on removable portion 220, other embodiments may be provided where the percentage of test points on functional portion 210 is the same or greater than the percentage of test points on removable portion 220. For example, a circuit board having side mounted test points on one or more sides of the functional portion 210 may outnumber the number of test points on removable portion 220 regardless of whether removable portion 220 has side, top, and/or bottom mounted test points.

FIG. 2 shows a circuit board 200 having removable portion 220 attached to a first side of functional portion 210, though it is understood that many different circuit board arrangements may be practiced in accordance with the principles of the present invention. A few examples of these different arrangements are shown in FIGS. 3A-I, each of which show a top view of different circuit boards according to the principles of the present invention. FIGS. 3A-D show circuit boards including a functional portion 310 and a removable test point portion 320 located on only one side of functional portion 310. In particular, removable test point portion 320 is located on the right, left, bottom, and top sides of functional portion 310 as shown in FIGS. 3A, 3B, 3C, and 3D, respectively. FIGS. 3E-I show circuit boards including removable portions 320 attached to at least two sides of functional portion 310. In particular, FIG. 3E shows two removable portions 320 attached to adjacent sides of functional portion 310. FIGS. 3F and 3G show two removable portions 320 attached on opposite sides (left and right in FIG. 3F and top and bottom in FIG. 3G) of functional portion 310. FIG. 3H shows three removable portions 320 attached to three sides of functional portion 310, whereas FIG. 3I shows four removable portions 320 attached to four sides of functional portion 310.

Figure 3L:
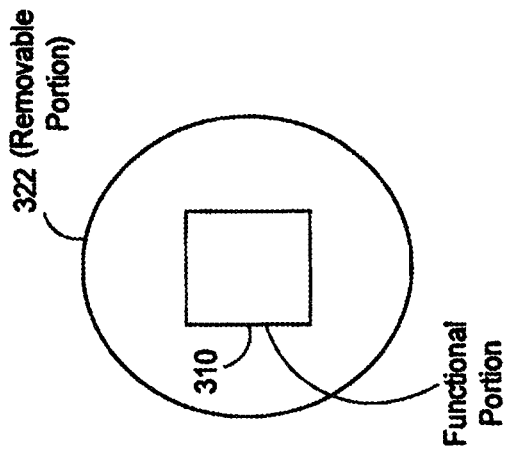
Figure 3K:
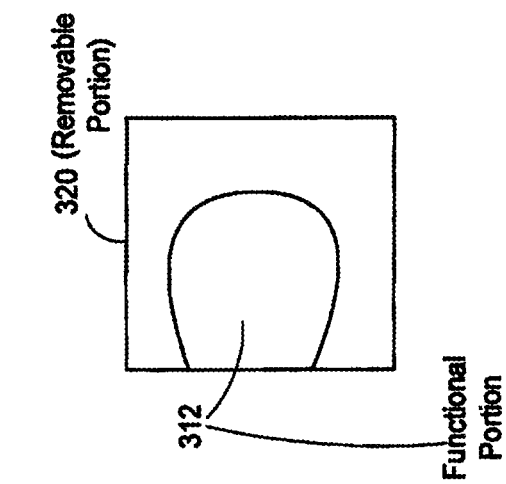
Figure 3J:
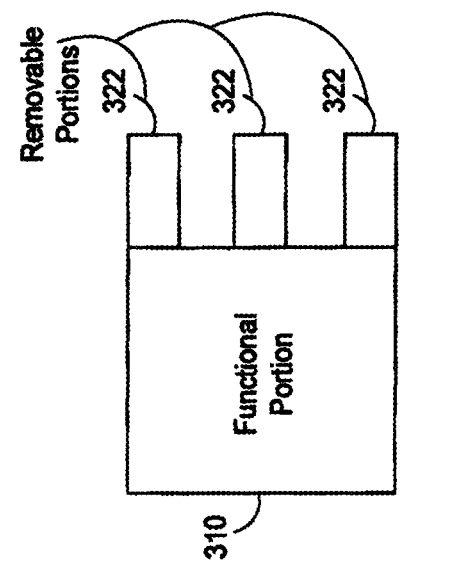

FIG. 3J shows a circuit board having several removable portions 320 attached to a side of functional region 310. Including several independently removable portions 322 with a circuit board may provide flexibility in testing and installation of the circuit board in an end use device. For example, it may be desirable to test a portion of the circuit board, remove the removable portion 322 including the test points used for testing that portion, and at least partially install (e.g., attach a device to the board) the circuit board. Then, when the circuit board is at least partially installed, further testing may be performed using the remaining removable portions. After testing, the remaining removable portions may be removed. The foregoing example is not limited to the embodiment of FIG. 3J and may be practiced in any circuit board according to the invention having at least two removable portions (e.g., FIGS. 3E-I).

FIG. 3K shows a circuit board in which a removable portion 320 can be attached to a functional portion 312 that is non-rectilinear. As shown, the circuit board has a removable portion 320 surrounding a large portion of non-rectilinear functional portion 312. FIG. 3L shows a circuit board having a functional portion 310 completely surrounded by a removable test point portion 322.

It is understood that the arrangements discussed in FIGS. 3A-L are merely illustrative and that different arrangements may be practiced by the present invention.

Figure 4:
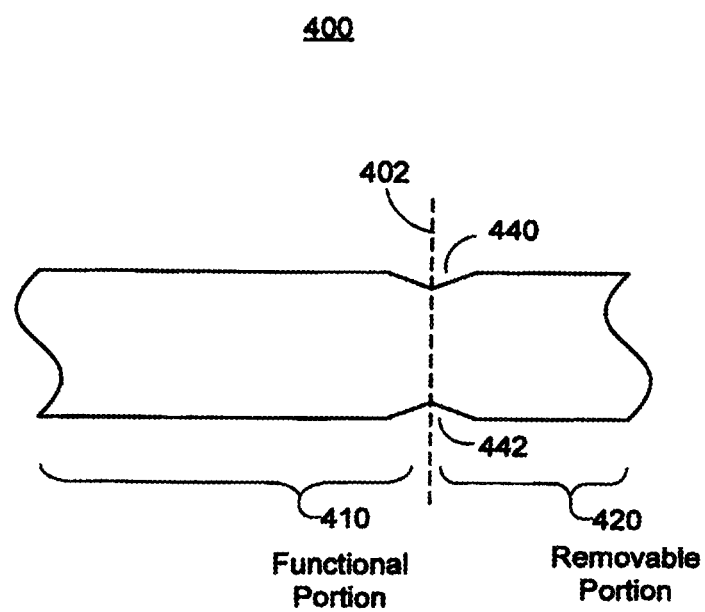
FIG. 4 shows a side-view of a portion of a simplified block diagram of a circuit board constructed in accordance with the principles of the present invention.

Circuit boards according to the invention may be constructed to facilitate removal of a removable test point portion. Referring to FIG. 4, a side-view of a portion of a simplified block diagram of a circuit board 400 constructed in accordance with the principles of the present invention is shown. Circuit board 400 shows functional portion 410 and removable portion 420 coupled together (at dashed line 402). Cleavable portions 440 and 442 may exist in the top and bottom portions of board 400, respectively, to promote removal of removable portion 420. If desired, additional cleavable portions (not shown) may be provided on one or more sides of circuit board 400. Cleavable portions 440 and 442 may influence a breakage point between portions 410 and 420, akin to how a perforation promotes separation in paper, by intentionally making a portion of the board more susceptible to breakage than other portions of the board. In addition, cleavable portions 440 and 442 may also serve as a "guide channel" for a cleaving tool that may be used to separate portions 410 and 420. For example, assuming the cleaving tool punches through the board to sever the portions, it may be inserted into the "guide channel" prior to punching through, thereby ensuring the punch occurs at the right location on the board.

The removable test point portion of a circuit board according to the invention may be removed using any number of suitable approaches. For example, the removable portion may be removed by cleaving (whether by application of a cutting object such a saw or a high energy source such as a laser), punching, or other suitable approach.

Figure 5:
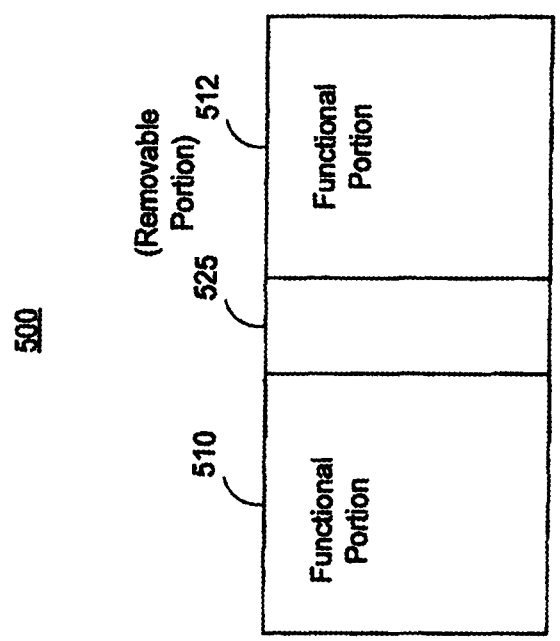
FIG. 5 shows a circuit board arrangement in which two functional portions share a common removable test point portion in accordance with the principles of the present invention.

FIG. 5 shows a circuit board arrangement in which two functional portions share a common removable test point portion in accordance with the principles of the present invention. As shown, a shared removable test point portion 525 is attached to functional portions 510 and 512. Shared portion 525 may include test points (not shown) common to both portions 510 and 512, test points (not shown) specific to either portion 510 or 512, or a combination of both common and specific test points. A common test point may be electrically coupled to one or more of the same components or signal conducting pathways in both portions 510 and 512. Common test points may enable a testing device to test two or more functional portions at a time, thereby reducing testing time and extra material cost. Specific test points may be electrically connected to only one functional portion (e.g., portion 512).

Figure 6:
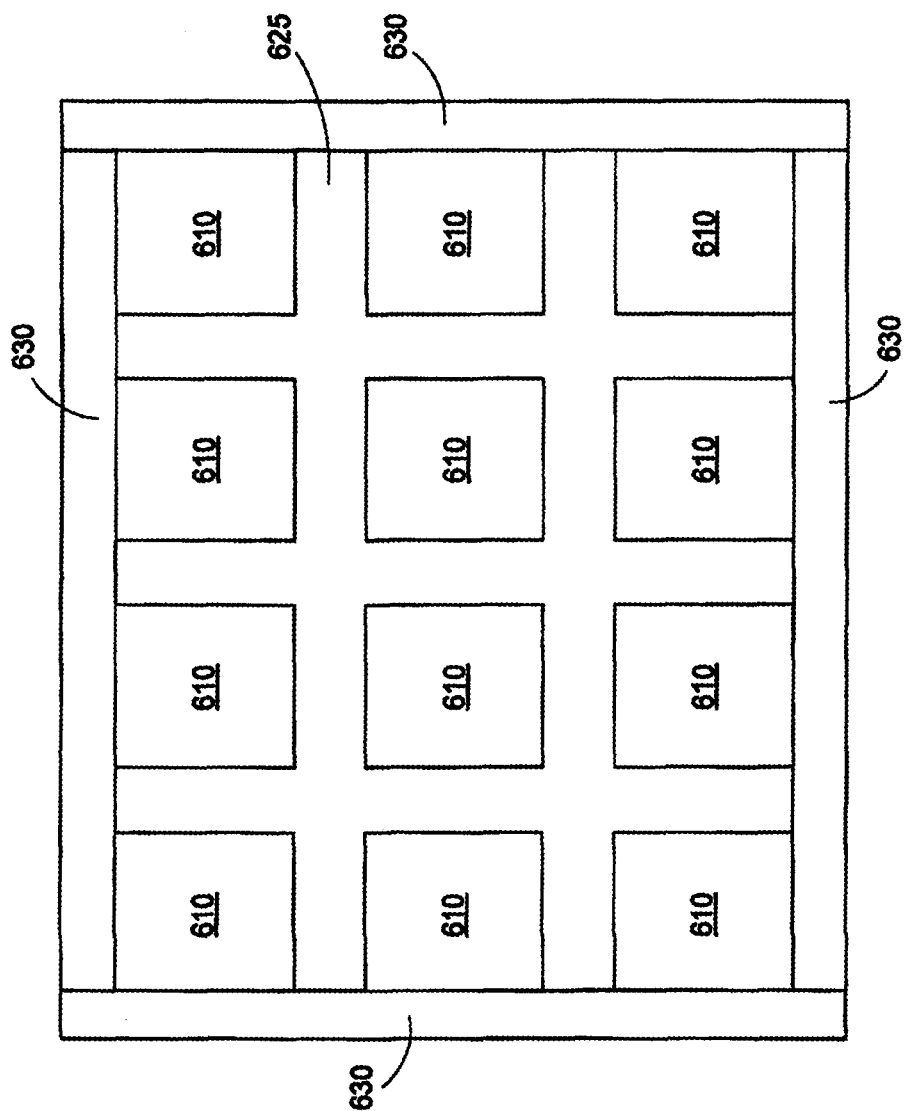
FIG. 6 shows an illustrative circuit board including several functional portions bridged by a shared removable test point portion in accordance with the principles of the present invention.

Shared removable test point portion 525 may serve as a bridge among two or more functional portions, and as such, may provide an interconnecting framework for enabling a circuit board to be populated with several functional portions, which can be tested using removable test point portions. FIG. 6 shows an illustrative circuit board 600 including several functional portions 610 bridged by shared removable test point portion 625 in accordance with the principles of the present invention. As shown, circuit board 600 includes an N-by-M matrix of functional portions 610, where N represents a predetermined number of functional portions 610 along a x-coordinate (shown as four portions) and where M represents a predetermined number of functional portions along a y-coordinate (shown as three portions). Interspersed among functional portions 610 is shared removable test point portion 625 (shown as a contiguous bridge within board 600). Shared removable test point portion 625 may include common test points and/or specific test points located on the top, bottom, or both top and bottom sides of board 600. Also shown are removable test point portions 630 disposed on the outside edges of circuit board 600. Removable test point portions 630 may include specific test points located on the edge, top, bottom, or a combination thereof of board 600.

An advantage of using shared removable test point portion 625 is that it may be sized to yield a circuit board for testing by existing testing devices. For example, because the location of test probes of a testing device is known, shared removable test point portion 625 may be constructed such that the test probes of the testing device align with the test points located on the portion 625 when the test probes are applied. Thus, cost savings may be realized by using a "generic" testing device to test different functional portions, each having different end-use purposes.

Figure 7:
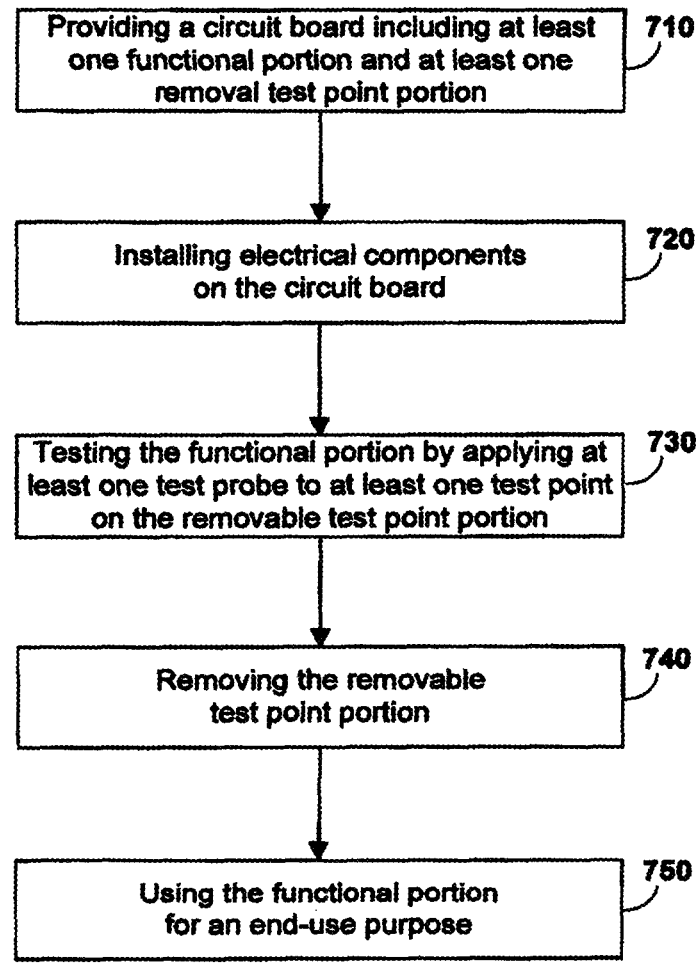
FIG. 7 is a flowchart showing steps that may be performed using a circuit board including at least one removable portion in accordance with the principles of the present invention.

FIG. 7 is a flowchart showing steps that may be performed using a circuit board including at least one removable portion in accordance with the principles of the present invention. At step 710, a circuit board including at least one functional portion and at least one removable test point portion is provided. For example, any one of the circuit boards discussed above in connection with FIGS. 2-6 may be provided. At step 720, electrical components (e.g., integrated circuits, resistors, and capacitors) may be installed on the circuit board. The electrical components may be installed using known techniques such as soldering, pinch crimps, snap connections, and any other known technique for securing an electrical connection.

Concurrently with or after the installation of electrical components, the functional portion may be tested by applying at least one test probe to at least one test point on the removable test point portion (as indicated at step 730). The testing may check a test site on functional portion such as, for example, whether a particular electrical component is electrically coupled to a signal conducting pathway or another electrical component. Test probes may be applied to top, bottom, and/or side mounted test points.

At step 740, a removable test point portion may be removed from the circuit board, thereby yielding the functional portion for an end-use purpose. When the removable test point portion is removed, exposed leads (e.g., signal conducting pathway) on the functional portion may be treated to prevent corrosion. The exposed leads may be treated by applying an epoxy, wax, or anti-oxidizing agent to the exposed leads. At step 750, the functional portion may be used for an end-use purpose.

It is understood that the steps illustrated in FIG. 7 are merely illustrative and that additional steps may be added and that existing steps may be omitted. For example, the step of treating exposed leads may be added.

Figure 8:
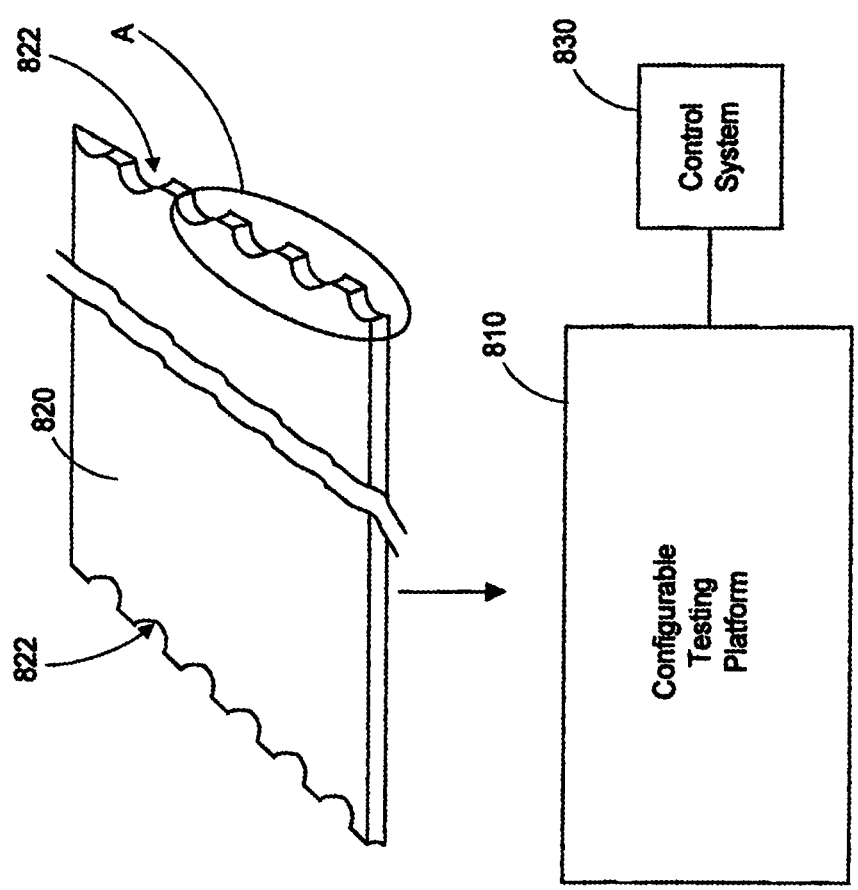
FIG. 8 shows a block diagram of a black-box abstraction of a configurable testing platform constructed according to the principles of the present invention.
Figure 9:
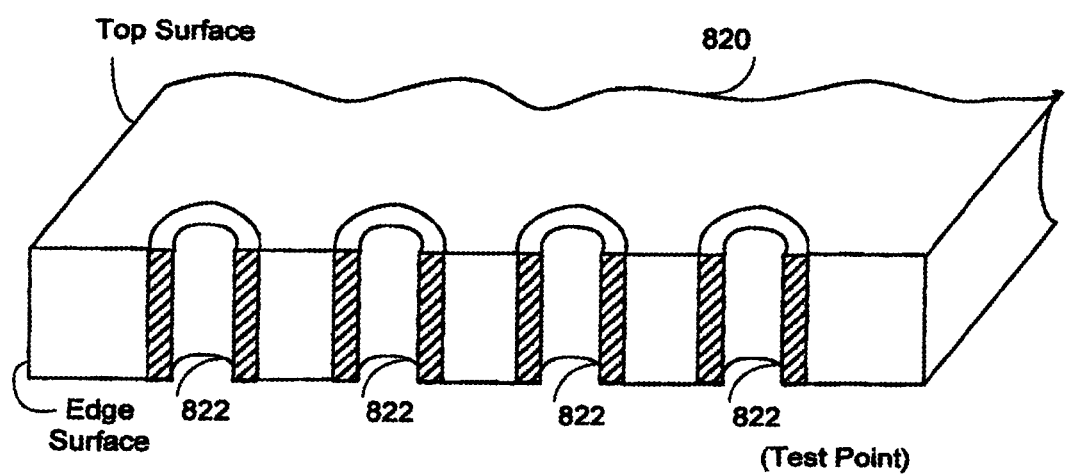
FIG. 9 shows a blown-up partial cross-sectional view of a section of the circuit board of FIG. 8 in accordance with the principles of the present invention.

FIG. 8 shows a block diagram of a black-box abstraction of a configurable testing platform constructed according to the principles of the present invention. Configurable testing platform 810 abstractly represents one of many different testing device embodiments according to the invention that may receive and test a circuit board 820, in particular, a circuit board having side mounted test points (shown as test point 822). A detailed discussion of circuit boards having side mounted test points can be found the in the above-identified patent application entitled "Methods and Apparatuses for Testing Circuit Boards," however, for convenience, FIG. 9 is provided to show a blown-up partial cross-sectional view of section A of circuit board 820, illustrating side mounted test points 822 on an edge surface of board 820. Note the construction of side mounted test point 822 is consistent from one test point to another (e.g., in distance between test points and the size of each test point), showing that the construction may conform to side mounted test point construction standard.

Referring back to FIG. 8, configurable platform 810 may be physically configurable to receive circuit boards of different size. In fact, circuit board 820 is drawn to show it may vary in size (shown as having a varying lengthwise direction), as indicated by the gap separating the board. It is understood that circuit board 820 may vary in size in the widthwise and heightwise directions as well. The physical configurability may be realized using circuit boards having side mounted test points because the location of the side mounted test points may not vary in the same manner as top or bottom mounted test point may vary. That is, for any given circuit board having side mounted test points, many such circuit boards may be constructed to have similar standards. Therefore, regardless of the length and width of the circuit board, use of side mounted test points may be consistent from one board to the next. Such consistency provides a stable foundation for constructing a test probe array, which may interface with the side mounted test points, regardless of board size and end-use purpose. Preferably, the width of the test probe array is at least as wide as the widest circuit board to be tested on platform 810, thereby ensuring universal accommodation of all desired circuit boards. In addition, at least one test probe array may be movable to accommodate circuit boards of different lengths, as will be explained in greater detail in connection with the discussion accompanying FIGS. 10-12. In some embodiments, control system 830 may control movement of the at least one movable test probe array by, for example, adjusting pneumatics or drive belts connected to the movable test probe array. Note that one of the test probe arrays may be a member that holds a received circuit board in place, but is not able to interface with test point.

In addition, configurable platform 810 may be electrically configurable to accommodate different circuit boards. Different boards, and thus the test points of those boards, may require specific signals during testing. The test probe array or arrays of configurable testing platform 810 may configure each test probe to provide a desired signal. Electrical configuration may be accomplished using test probe signal selection circuitry according to the principles of the present invention and discussed in more detail below in connection with the discussion accompanying FIG. 13. In some embodiments, the selection of signals provided to test probes may be performed by control system 830.

Figure 10:
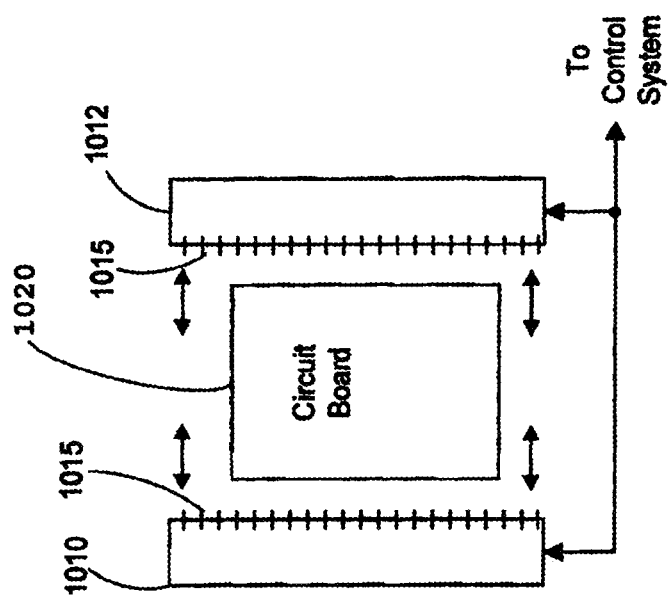
FIG. 10 shows a simplified top view of a configurable testing platform in accordance with the principles of the present invention.

FIG. 10 shows a simplified top view of a configurable testing platform 1000 in accordance with the principles of the present invention. Testing platform 1000 includes test probe arrays 1010 and 1012, each of may include several test probes 1015. Test probe arrays 1010 and 1012 are located on opposite sides of circuit board 1020. One or both test probe arrays 1010 and 1012 may be movable. If movable, the array may be coupled to a precision controlled movement system (not shown). For example, a pneumatic system or a track system (e.g., linear slide) may be used to provide precisely controlled movement of one or both test probe arrays 1010 and 1012. In the pneumatic system, pneumatics may be attached to probe arrays 1010 and 1012 to control positioning with respect to circuit board 1020. In the track system, probe arrays 1010 and 1012 may reside on carriages that can be moved to desired locations on the track.

Testing platform 1000 may provide automated interfacing with and testing of circuit board 1020. For example, circuit board 1020 may be placed in a predetermined position in the platform 1000 and a user may indicate to a control system (not shown) the type of circuit board 1020. The control system may automatically adjust one or both test probe arrays 1010 and 1012 such that relevant test probes 1015 are interfaced with the test points (not shown) of circuit board 1020. Note that some test probes may not interface with circuit board 1020 when test probe arrays 1010 and 1012 are in the "interfacing position". Such non-interfaced probes may not affect the testing performed by testing platform. In fact, the control system (not shown) may configure such non-interfaced probes to be null (e.g., by coupling such nodes to ground). The interfaced probes may be electrically configured to accommodate circuit board. When test probe arrays 1010 and 1012 are in the interfacing position, testing may commence.

Figure 11A:
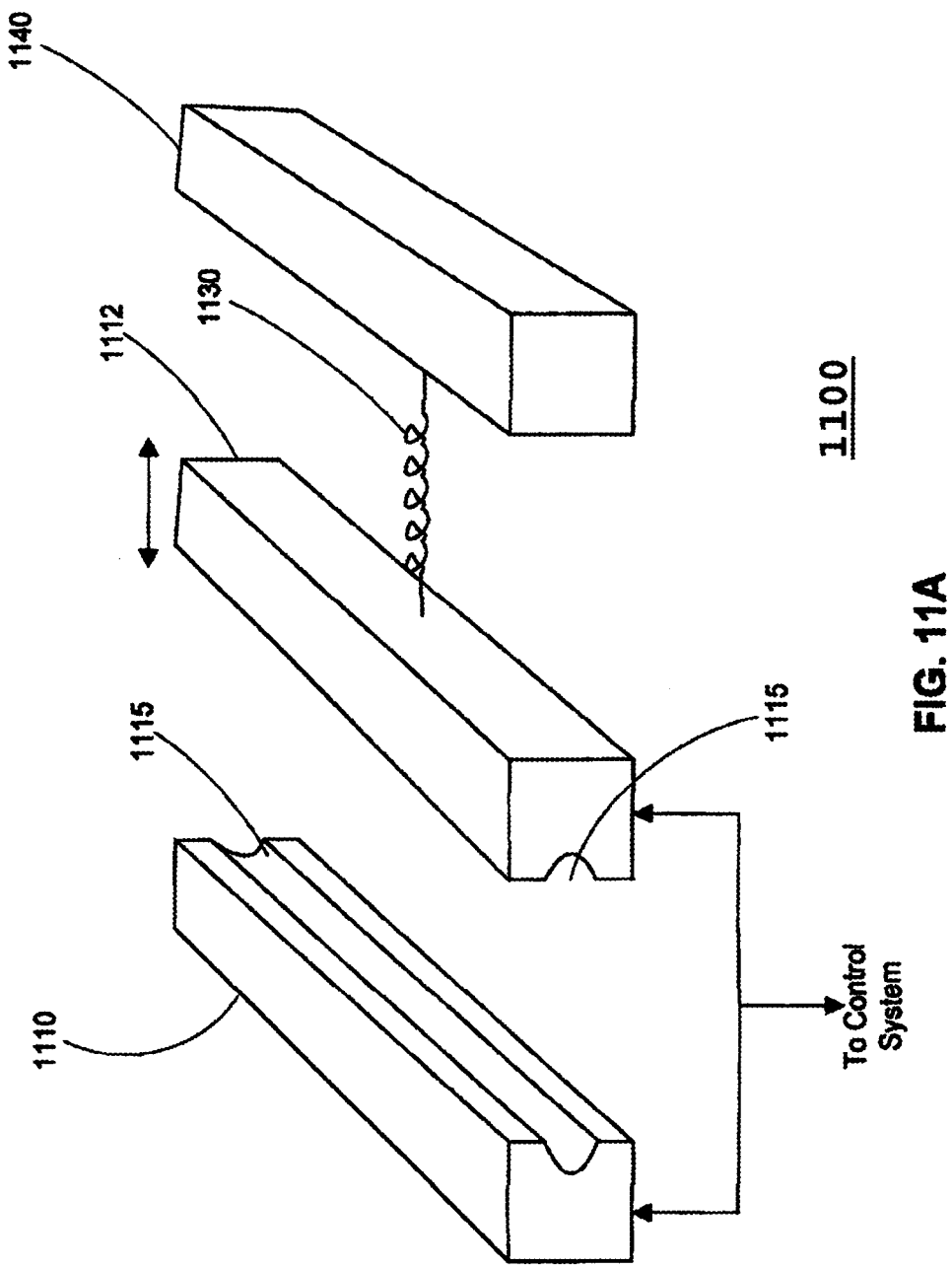
FIGS. 11A and 11B show simplified views of another configurable testing platform in accordance with the principles of the present invention.
Figure 11B:
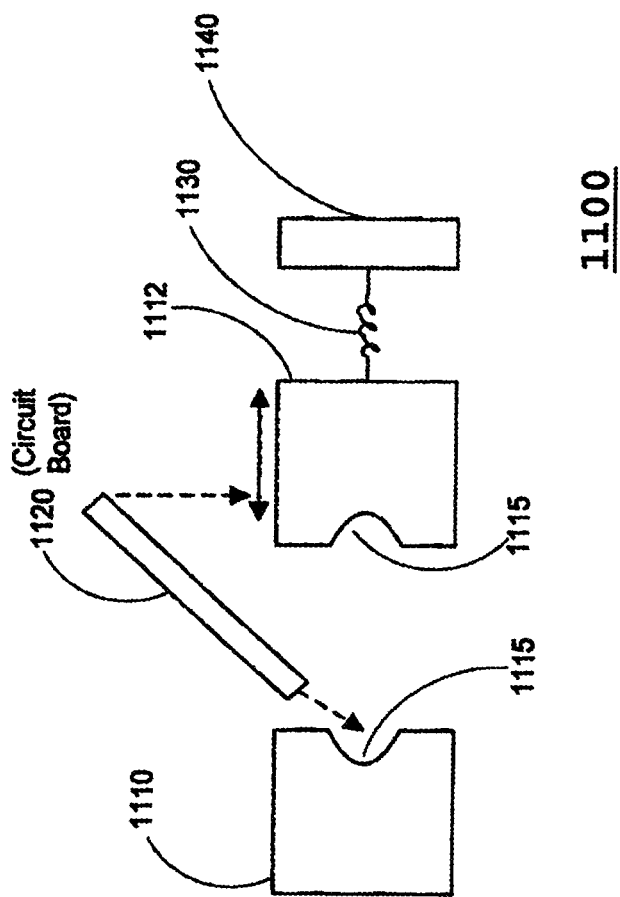

FIG. 11A shows a simplified perspective view of another configurable testing platform 1100 in accordance with the principles of the present invention. FIG. 11B shows a simplified side view of configurable testing platform 1100 in accordance with the principles of the present invention. Reference will be made to both FIGS. 11A and 11B during the discussion of testing platform 1100. Configurable testing platform 1100 includes fixed test probe array 1110 and movable test probe array 1112, each of which may include test probes 1115 (shown as the concaved portions). Test probe arrays 1110 and 1112 may be electrically coupled to a control system (not shown) for electrically configuring test probes 1115.

Fixed test probe array 1110 is fixed in a permanent position in platform 1100, serving as an anchor for accepting circuit board 1120. Movable test probe array 1112 is free to slide in a linear direction towards and away from fixed test probe array 1110. When circuit board 1120 is received by platform 1100, a first end of board 1120 may be inserted into test probe array 1110, movable test probe array 1112 may be moved away from fixed test probe array 1110 to provide clearance for a second end of board 1120 to be received by movable test probe array 1112. Movable test probe array 1112 may be coupled to a tension member 1130 which is fixed to anchor member 1140. Tension member 1130 may be a coil spring or other tension inducing object or device that exerts linear pressure on movable test probe array 1112 in the direction of fixed test probe array 1110. Tension member 1130 may be designed such that sufficient pressure is exerted on movable test probe array 1112 to ensure a secured interfacing position is obtained for circuit boards of any desired size.

Figure 12:
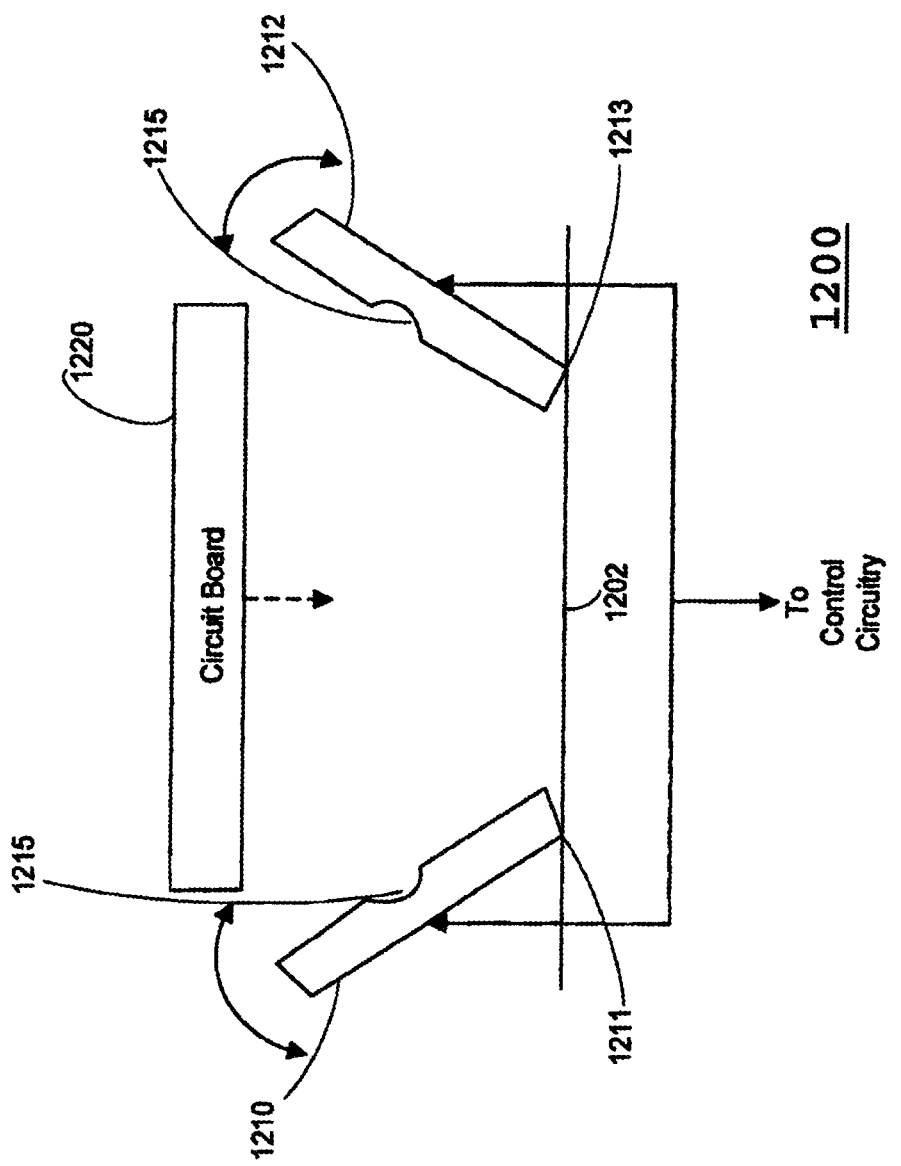
FIG. 12 shows a simplified side view of yet another configurable testing platform according to the principles of the present invention.

FIG. 12 shows a simplified side view of yet another configurable testing platform 1200 according to the principles of the present invention. Configurable testing platform 1200 includes test probe arrays 1210 and 1212, both of which may include test probes 1215 (as shown by the concaved portion). Test probe arrays 1210 and 1212 may be electrically coupled to a control system (not shown) for electrically configuring test probes 1215. Test probe arrays 1210 and 1212 may rotate about axis's 1211 and 1213, respectively. Referring specifically to array 1210, array 1210 may rotate from a ninety degree angle (at which point array 1210 is perpendicular to platform base 1202) to a predetermined angle less than ninety degrees. Arrays 1210 and 1212 may be tension loaded such that they are biased to reside at the ninety degree angle. Such a bias may be desired to ensure sufficient test probe array pressure is exerted on circuit board 1220 when in an interfacing position.

When configurable testing platform receives circuit board 1220, test probe arrays 1210 and 1212 may rotate away from circuit board 1220 to accommodate circuit boards of different size. For example, board 1220 itself may cause test probes arrays 1210 and 1212 to rotate away from board 1220 until board 1220 is secured in place by test probes 1215. In some embodiments, the test probes 1115 may move independently of the rotation of test probe arrays 1210 and 1212 to further promote interfacing of circuit board test points (not shown) to test probes 1215. For example, as the lean angle of arrays 1210 and 1212 decreases (i.e., drops from ninety degrees to a predetermined angle), the position of the test probes 1215 may be counter-rotated with respect to the rotation of array 1210 and 1212 so that test probes 1215 are better able to make contact to the test points. In other words, test probes 1215 may be constructed on a independently rotating carriage which may allow the relative position of test probes 1215 (within arrays 1210 and 1212) to remain substantially the same regardless of the lean angle. As such, the relative position of test probes 1215 may be same when arrays 1210 and 1212 are at a ninety degree angle as when arrays 1210 and 1212 are at a seventy degree angle.

Figure 13:
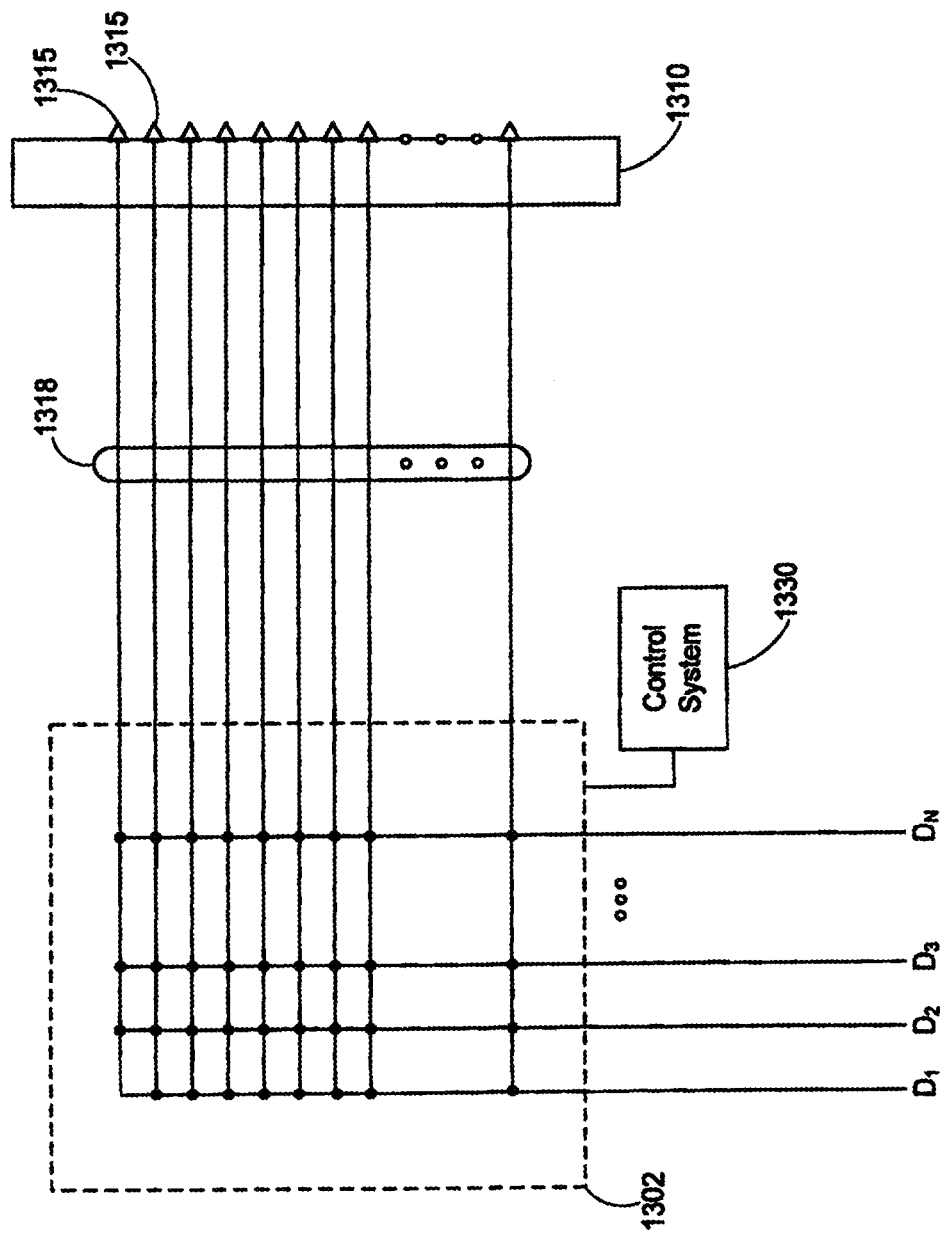
FIG. 13 shows test probe signal selection circuitry that may be used to electrically configure testing platforms in accordance with the principles of the present invention.

FIG. 13 shows a test probe signal selection circuitry 1302 that may be used to electrically configure testing platforms in accordance with the principles of the present invention. Also shown in FIG. 13 is test probe array 1310 that has several test probes 1315. Each test probe is coupled to a test probe data line 1318. Each test probe data line 1318 may be selectively electrically coupled to any one of source data lines $D_1$ through $D_N$ by selection circuitry 1310, based on the circuit board to be interfaced to test probe array 1310. Source data lines may include signals of different voltage and current and other test data signals. The data for the source data lines may be supplied by and monitored by control system 1330.

An advantage of selection circuitry 1310 is the ease in which a testing platform can be electrically reconfigured for interfacing with a different circuit board. In digital implementations of selection circuitry 1310, control signals provided by control system 1330 may cause selection circuitry 1310 to selectively electrically couple the appropriate source data line to the test probe data line. Each dot represents a "switch" that may be selectively turned ON and OFF to electrically couple a source data line to a particular test probe data line. A digital implementation may include a multiplexor, a digitally controlled switch matrix (e.g., an FPGA) or a software emulation of such hardware. Selection circuitry 1310 may also be implemented in a manual implementation such as, for example, a manually controlled switch matrix which may require a user to physically insert and/or remove jumpers to affect the desired electrical couplings.

Figure 14:
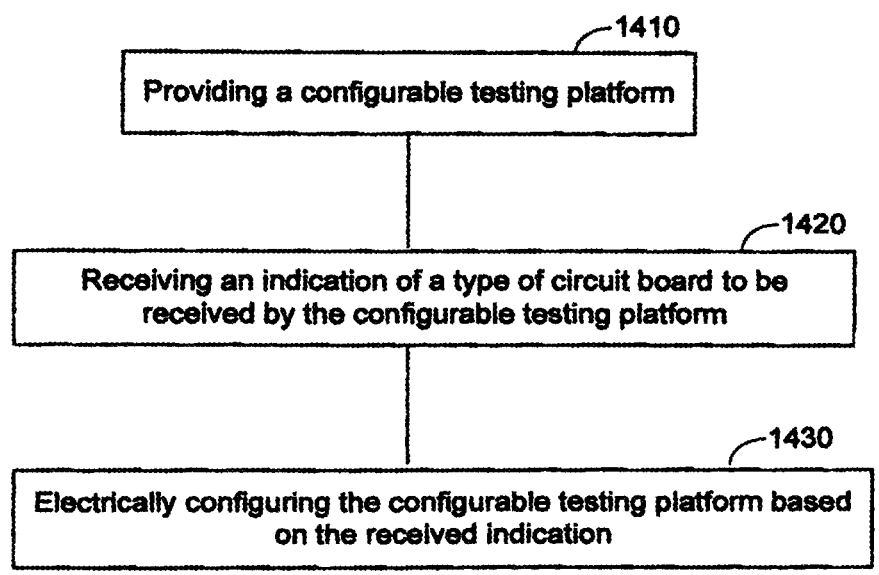
FIG. 14 shows a flowchart illustrating steps that may be taken to interface a configurable testing platform to a circuit board in accordance with the principles of the present invention.

FIG. 14 shows a flowchart illustrating steps that may be taken to interface a configurable testing platform to a circuit board in accordance with the principles of the present invention. At step 1410, a configurable testing platform is provided (e.g., platforms 1000, 1100, or 1200 of FIGS. 10, 11, and 12, respectively). At step 1420, an indication is received of the type of circuit board to be received by the testing platform. For example, a user may input into a control panel or computer which circuit board is to be tested. At step 1430, the testing platform is electrically configured based on the received indication. More particularly, the test probes may be "primed" for testing a specific circuit board by selectively electrically coupling the test probe to a particular data line using, for example, test probe signal selection circuitry 1302 of FIG. 13.

Figure 15:
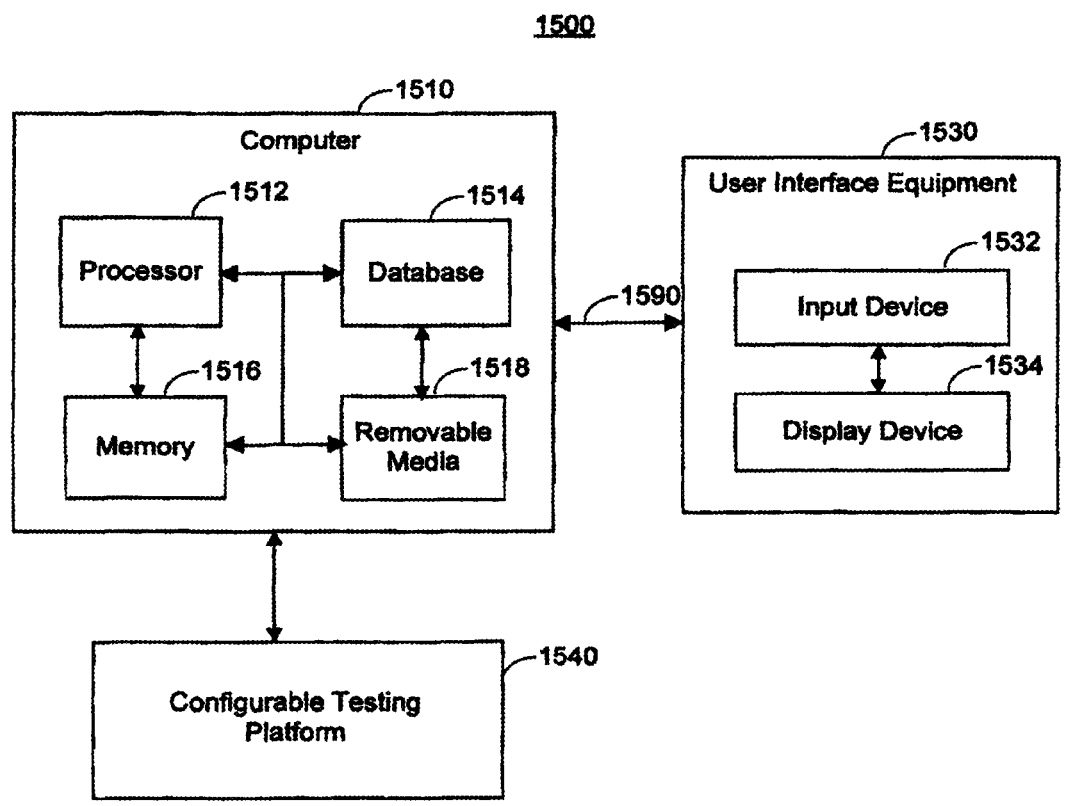
FIG. 15 shows an illustrative system 1500 that may be used in connection with a configurable testing platform in accordance with the principles of the invention.

FIG. 15 shows an illustrative system 1500 that may be used in connection with a configurable testing platform in accordance with the principles of the invention. System 1500 may include computer 1510, user interface equipment 1530, and configurable testing platform 1540. System 1500 may include multiple computers 1510 and user interface equipment 1530, but only one of each is illustrated in FIG. 15 to avoid complicating the drawing. Computer 1510 is shown connected to user interface equipment 1530, and platform 1540 via communication paths 1590.

Computer 1510 may include circuitry such as a processor 1512, database 1514 (e.g., a hard-drive), memory 1516 (e.g., random-access-memory), and removable-media drive 1518 (e.g., a floppy disk drive, a CD-ROM drive, or a DVD drive). This circuitry can be used to transmit data to, from, and/or between user interface equipment 1530 and the platform 1530. Computer 1510 may configure platform 1530 (e.g., electrically and/or physically configure) by responding to user input (e.g., a specified type of circuit board) from user interface equipment 1530. Computer 1510 may also provide information to the user at user interface equipment 1530 with respect to results obtained from testing a circuit board interface with platform 1540 according to embodiments of the invention. Database 1514 may store information such as, for example, configuration settings to be used for selected circuit boards.

User interface equipment 1530 enables a user to input commands to computer 1530 via input device 1532. Input device 1532 may be any suitable device such as a conventional keyboard, a wireless keyboard, a mouse, a touch pad, a trackball, a voice activated console, or any combination of such devices. Input device 1532 may, for example, enable a user to enter commands to test a circuit board. A user may view the test results on display device 1534. Display device 1534 may be a computer monitor, a television, a flat panel display, a liquid crystal display, a cathode-ray tube (CRT), or any other suitable display device.

Communication paths 1590 may be any suitable communications path such as a cable link, a hard-wired link, a fiber-optic link, an infrared link, a ribbon-wire link, a blue-tooth link, an analog communications link, a digital communications link, or any combination of such links. Communications paths 1590 are configured to enable data transfer between computer 1510, user interface equipment 1530, and platform 1540.

It will also be understood that various directional and orientational terms such as "vertical" and "horizontal," "left" and "right," "top" and "bottom," "edge," "height," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention.

Thus it is seen that circuit boards with removable test point portions and configurable testing platforms are provided. Those skilled in the art will appreciate that the invention can be practiced by other than the described embodiments, which are presented for purposes of illustration rather than of limitation, and the invention is limited only by the claims which follow.

What is claimed is:

1. A testing system for testing a side mounted circuit board having a side plane having side mounted test points, the testing system comprising:
    a testing platform operable to receive the one circuit board, the testing platform comprising:
        a first member and a second member for securing the one circuit board in place, wherein at least one member of the first member and the second member is movable such that the testing platform is capable of receiving circuit boards of different sizes, and wherein the at least one member comprises a test probe array comprising a plurality of test probes electrically configured by a test probe signal selection circuitry for passing signals between a control system electrically coupled to the test probe array and the side mounted test points of the circuit board.

2. The testing system of claim 1, wherein the first member is fixed, the second member is movable, and the second member is coupled to a tension member that exerts a force on the second member to assist in securing the at least one circuit board.

3. The testing system of claim 1, wherein the first member and the second member are movable in a linear direction.

4. The testing system of claim 1, wherein the first member and second member are movable in a radial direction.

5. The testing system of claim 1, wherein the first member and the second member each comprise the test probe array.

6. The testing system of claim 1, further comprising:
    wherein the control system is configured to provide test signals to the plurality of test probes to test the at least one circuit board.

7. A method for configuring a testing platform operative to receive and test a plurality of circuit boards of different size and end-use purpose, the method comprising:
    receiving an indication of a type of circuit board to be received by the testing platform; and electrically configuring the testing platform based on the received indication by a test probe signal selection circuitry the testing platform comprising: a first member and a second member for securing the at least one circuit board in place wherein at least one member of the first member and the second member is movable such that the testing platform receive circuit boards of different sizes and wherein the at least one member comprises a test probe array comprising a plurality of test probes for interfacing with side mounted test points of the at least one circuit board; and
    testing the circuit board by a control system electrically coupled to the test probe signal selection circuitry.

8. The method of claim 7, wherein electrically configuring comprises selectively electrically coupling a test probe to one of a plurality of source data lines.

9. The method of claim 7, wherein the testing platform comprises at least one test probe array comprising test probes for interfacing with side mounted test points of the circuit board, the electrically configuring comprises configuring the test probes based on the received indication.

10. A testing platform operable to receive and test at least one circuit board, the testing platform comprising:
   a first member and a second member for securing the at least one circuit board in place, wherein at least one member of the first member and the second member is movable such that the testing platform is capable of receiving circuit boards of different sizes, and wherein the at least one member comprises a test probe array comprising a plurality of test probes for interfacing with side mounted test points of the at least one circuit board, and
   a test probe signal selection circuitry coupled to a control system and operative to electrically configure the plurality of test probes of the test probe array.

11. The testing platform of claim 10, wherein the first member is fixed, the second member is movable, and the second member is coupled to a tension member that exerts a force on the second member to assist in securing the at least one circuit board.

12. The testing platform of claim 10, wherein the first member and the second member are movable in a linear direction.

13. The testing platform of claim 10, wherein the first member and second member are movable in a radial direction.

14. The testing platform of claim 10, wherein the first member and the second member each comprise the test probe array.

* * * * *